(12) United States Patent
Burkett et al.

(10) Patent No.: US 12,239,027 B2
(45) Date of Patent: Feb. 25, 2025

(54) JOSEPHSON JUNCTIONS WITH REDUCED STRAY INDUCTANCE

(71) Applicant: Google LLC, Mountain View, CA (US)

(72) Inventors: Brian James Burkett, Santa Barbara, CA (US); Ofer Naaman, Santa Barbara, CA (US); Anthony Edward Megrant, Goleta, CA (US); Theodore Charles White, Santa Barbara, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/117,918

(22) Filed: Mar. 6, 2023

(65) Prior Publication Data

US 2023/0225223 A1 Jul. 13, 2023

Related U.S. Application Data

(63) Continuation of application No. 16/964,053, filed as application No. PCT/US2019/043477 on Jul. 25, 2019, now Pat. No. 11,600,763.

(51) Int. Cl.
*H10N 60/01* (2023.01)
*G06N 10/00* (2022.01)
(Continued)

(52) U.S. Cl.
CPC ......... *H10N 60/0912* (2023.02); *G06N 10/00* (2019.01); *H10N 60/12* (2023.02); *H10N 60/805* (2023.02)

(58) Field of Classification Search
CPC ... H10N 60/0912; H10N 60/12; H10N 60/805
See application file for complete search history.

(56) References Cited

U.S. PATENT DOCUMENTS

2015/0119253 A1 4/2015 Yohannes et al.
2016/0211438 A1 7/2016 Chang et al.
(Continued)

FOREIGN PATENT DOCUMENTS

CN 108539004 9/2018
EP 3427310 1/2019
(Continued)

OTHER PUBLICATIONS

Barends et al., "Coherent Josephson qubit suitable for sclable quantum integrated circuits," Physical Review Letters, Aug. 2013, 111(8):080502.
(Continued)

*Primary Examiner* — Matthew L Reames
(74) *Attorney, Agent, or Firm* — Fish & Richardson P.C.

(57) ABSTRACT

Methods, systems and apparatus for forming Josephson junctions with reduced stray inductance. In one aspect, a device includes a substrate; a first superconductor layer on the substrate; an insulator layer on the first superconductor layer; a second superconductor layer on the insulator layer, wherein the first superconductor layer, the insulator layer, and the second superconductor layer form a superconductor tunnel junction; and a third superconductor layer directly on a surface of the first superconductor layer and directly on a surface of the second superconductor layer to provide a first contact to the superconducting tunnel junction and a second contact to the superconductor tunnel junction, respectively.

12 Claims, 15 Drawing Sheets

(51) Int. Cl.
    *H10N 60/12*      (2023.01)
    *H10N 60/80*      (2023.01)

(56) References Cited

U.S. PATENT DOCUMENTS

| | | |
|---|---|---|
| 2018/0358537 A1 | 12/2018 | Brink et al. |
| 2019/0363238 A1 | 11/2019 | Rosenblatt et al. |

FOREIGN PATENT DOCUMENTS

| | | |
|---|---|---|
| WO | WO 2018/030977 | 2/2018 |
| WO | WO 2019/055048 | 3/2019 |

OTHER PUBLICATIONS

Dunsworth et al., "Characterization and Reduction of Captive Loss Induced by Sub-Micron Josephson Fabrication in Superconducting Qubits," Applied Physics Letters, Jul. 2017, 111(2):022601.
International Preliminary Report on Patentability in International Appln. No. PCT/US2019/043477, dated Feb. 3, 2022, 8 pages.
International Search Report and Written Opinion in International Appln. No. PCT/US2019/043477, dated Apr. 14, 2020, 13 pages.
Kelly, "Fault-tolerant superconducting qubits," Dissertation for the degree of Doctor of Philosophy, University of California, Mar. 2015, 271 pages.
Third Party Observations in European Appln. No. 19752325.1, dated Dec. 17, 2021, 9 pages.
wikipedia.org [online], "Niemeyer-Dolan technique," last edited on Mar. 24, 2021, retrieved on Jan. 10, 2022, retrieved from URL<https://en.wikipedia.org/wiki/Niemeyer%E2%80%93Dolan_technique/>, 1 pages.
Office Action in Chinese Appln. No. 201980010108.X, mailed on Sep. 20, 2024, 9 pages (with English machine translation).

200

Provide substrate including first resist layer patterned to expose an opening region, wherein the opening region includes a central opening portion, a first elongated opening portion and a second elongated opening portion
202

Deposit first superconducting material on the patterned first resist layer at a first non-normal angle with respect to the substrate to form a first superconductor layer
204

Form insulator layer on a portion of the first superconducting layer
206

Deposit second superconductor material on the insulator layer and the patterned resist layer at a second non-normal angle with respect to the substrate to form a second superconductor layer
208

Form and pattern a second resist layer     210

Form third superconductor layer directly on surfaces of the first superconductor layer and second superconductor layer to provide a first contact and a second separate contact to the superconducting tunnel junction
212

FIG. 2

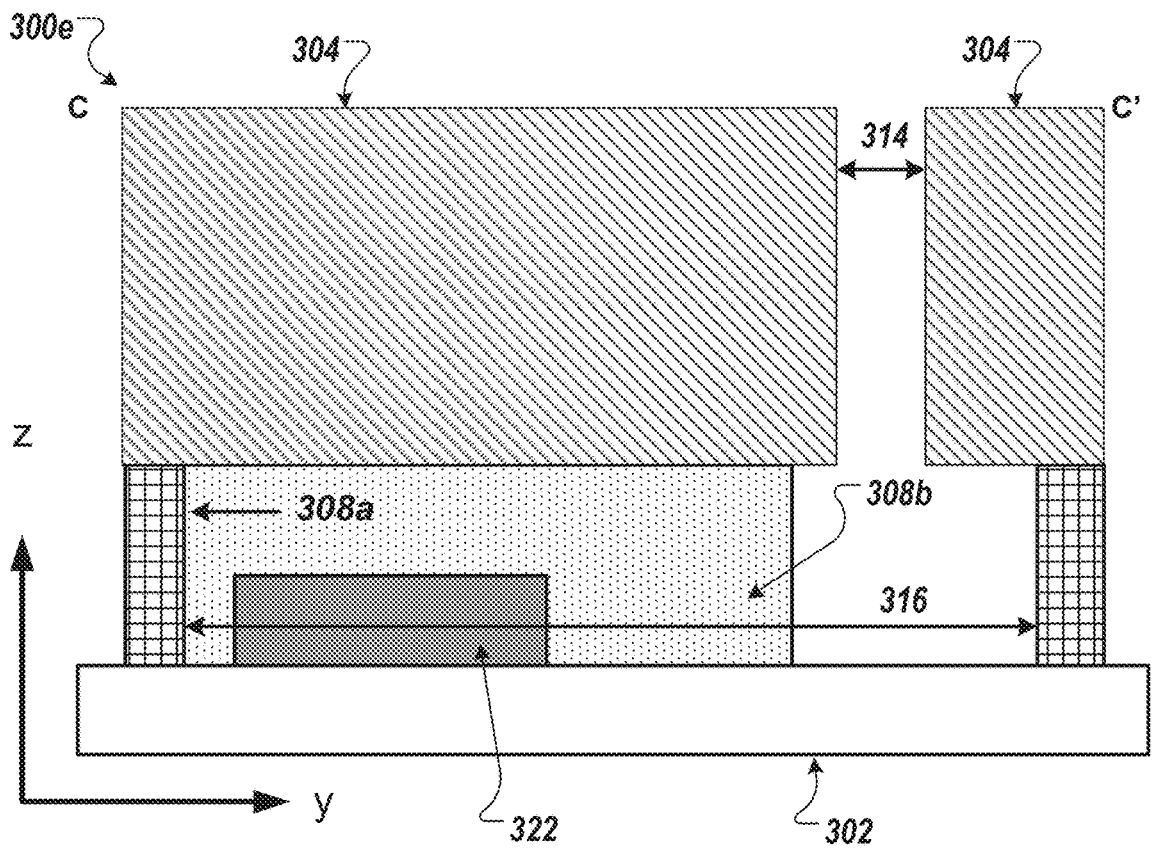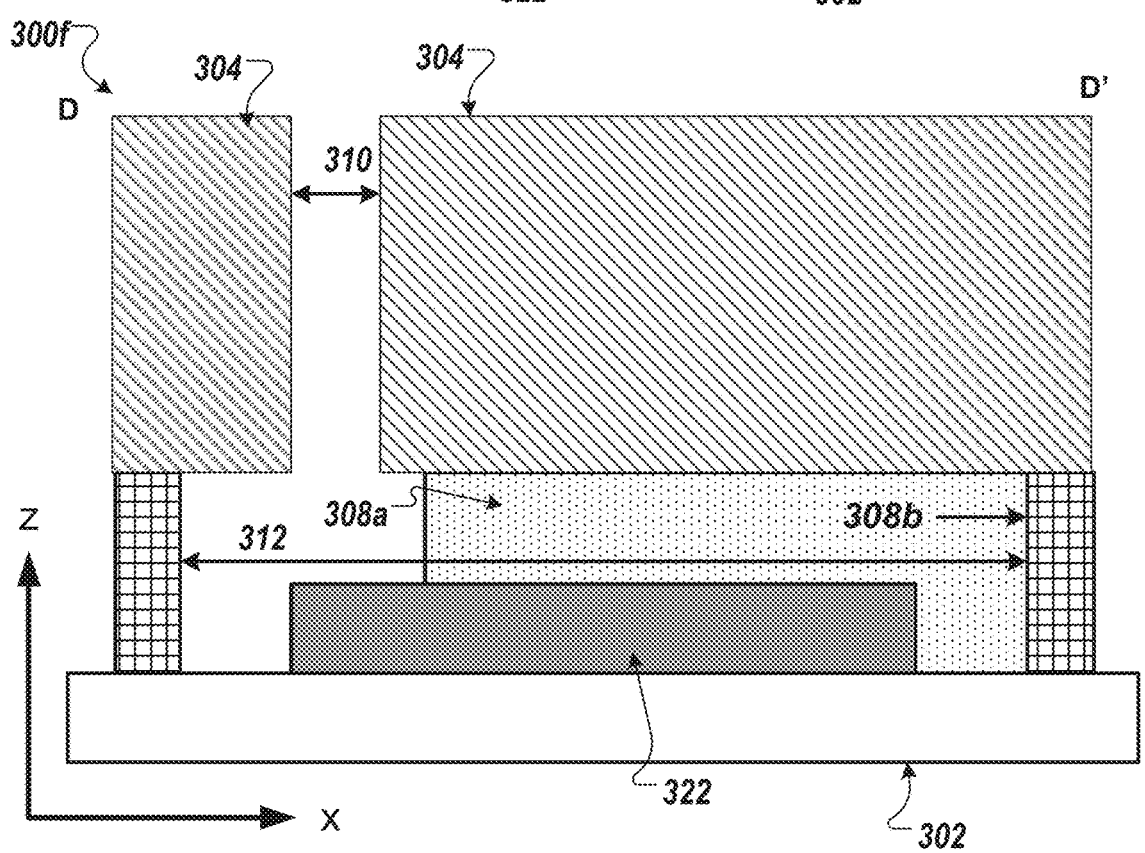
FIG. 3B (continued)

400

Provide substrate including first resist layer patterned to expose an opening region, wherein the opening region is laterally enclosed on all sides by the first resist layer 402

Deposit first superconducting material on the patterned first resist layer at a first non-normal angle with respect to the substrate to form a first superconductor layer 404

Form insulator layer on a portion of the first superconducting layer 406

Deposit second superconductor material on the insulator layer and the patterned resist layer at a second non-normal angle with respect to the substrate to form a second superconductor layer 408

Form third superconductor layer directly on surfaces of the first superconductor layer and second superconductor layer to provide a first contact and a second separate contact to the superconducting tunnel junction 410

FIG. 4

JOSEPHSON JUNCTIONS WITH REDUCED STRAY INDUCTANCE

CROSS-REFERENCE TO RELATED APPLICATION

This application is a continuation of U.S. patent application Ser. No. 16/964,053 filed Jul. 22, 2020, which is a National Stage Application under 35 U.S.C. § 371 and claims the benefit of International Application No. PCT/US2019/043477, filed Jul. 25, 2019. The disclosure of the foregoing applications are hereby incorporated by reference in their entirety.

TECHNICAL FIELD

The present disclosure relates to forming a tunnel junction for use in a Josephson junction.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum information processing devices can manipulate information using qubits. A qubit can refer to a quantum device that enables the superposition of multiple states (e.g., data in both the "0" and "1" state) and/or to the superposition of data, itself, in the multiple states. Example physical realizations of qubits include qubits that are realized using Josephson junctions.

SUMMARY

In general, one innovative aspect of the subject matter described in this specification can be implemented in a method that includes the actions of: providing a substrate comprising a first resist layer patterned to expose an opening region, wherein the opening region comprises a central opening portion, a first elongated opening portion having a length that extends from a first side of the central opening portion along a first direction, and a second elongated portion having a length that extends from a second side of the central opening portion along a second direction different from the first direction, wherein a width of the first elongated portion is smaller than a length of the first side of the central opening, and a width of the second elongated portion is smaller than a length of the second side of the central opening; depositing a first superconductor material on the patterned resist layer at a first non-normal angle with respect to the substrate to form a first superconductor layer within the central opening portion and the first elongated opening portion of the opening region; forming an insulator layer on a portion of the first superconductor layer; depositing a second superconductor material on the insulator layer and the patterned resist layer at a second non-normal angle with respect to the substrate to form a second superconductor layer within the central opening portion and the second elongated portion of the opening region, wherein the first superconductor layer, the insulator layer, and the second superconductor layer within the central opening portion provide a superconductor tunnel junction; and forming a third superconductor layer directly on a surface of the first superconductor layer and directly on a surface of the second superconductor layer to provide a first contact to the superconducting tunnel junction and a second separate contact to the superconductor tunnel junction, respectively.

The foregoing and other implementations can each optionally include one or more of the following features, alone or in combination. In some implementations the first superconductor layer is formed in a first section of the central opening portion, and the second superconductor layer is formed in a second section of the central opening portion, and the first section of the central opening portion and the second section of the central opening portion only partially overlap.

In some implementations the superconductor tunnel junction is formed where the first section of the central opening portion and the second section of the central opening portion partially overlap.

In some implementations the first contact is formed on the surface of the first superconductor layer outside of where the first section of the central opening portion and the second section of the central opening portion partially overlap, and the second contact is formed on the surface of the second superconductor layer outside of where the first section of the central opening portion and the second section of the central opening portion partially overlap.

In some implementations the first contact is formed on the surface of the first superconductor layer that is within the first elongated opening portion, and wherein the second contact is formed on the surface of the second superconductor layer that is within the second elongated opening portion.

In some implementations a width of the first contact is greater than a width of the first superconductor layer within the first elongated portion, and a width of the second contact is greater than the width of the second superconductor layer within the second elongated portion.

In some implementations forming the third superconductor layer comprises: forming a second resist layer on the first superconductor layer and the second superconductor layer; and patterning the second resist layer to form a first contact opening and a second contact opening; and depositing the third superconductor on the patterned second resist layer and removing the second resist layer to form the first contact and the second contact.

In some implementations the method further comprises performing an ion mill on a surface of the first superconductor layer exposed in the first contact opening and on a surface of the second superconductor layer exposed in the second contact opening prior to depositing the third superconductor layer.

In some implementations the first resist layer is patterned using optical lithography.

In some implementations an aspect ratio between a height of the first resist layer and a width of the first elongated opening portion or a width of the second elongated opening portion is between 1:1 and 10:1.

In some implementations a height of the resist layer is between approximately 0.1 microns to approximately 4 microns.

In some implementations the superconductor tunnel junction forms part of an analog circuit element or a single-flux quantum logic circuit element.

In general, another innovative aspect of the subject matter described in this specification can be implemented in a method that includes the actions of: providing a substrate comprising a first resist layer patterned to include an opening region that exposes a surface of the substrate, wherein the opening region is laterally enclosed on all sides by the first resists layer; depositing a first superconductor material on the patterned resist layer at a first non-normal angle with respect to the substrate along a first direction to form a first superconductor layer within the opening region, wherein the patterned resist layer blocks the first superconductor layer from forming in at least a first part of the opening region; forming an insulator layer on a portion the first superconductor layer; depositing a second superconductor material on the insulator layer and the patterned resist layer at a second non-normal angle with respect to the substrate along a second direction to form a second superconductor layer within the opening region, wherein the patterned resist layer blocks the second superconductor layer from forming in at least a second part of the opening region, and wherein the first superconductor layer, the insulator layer, and the second superconductor layer within the opening region provide a superconductor tunnel junction; and forming a third superconductor layer directly on a surface of the first superconductor layer and directly on a surface of the second superconductor layer to provide a first contact to the superconducting tunnel junction and a second separate contact to the superconductor tunnel junction, respectively.

The foregoing and other implementations can each optionally include one or more of the following features, alone or in combination. In some implementations the first superconductor layer is formed in a first section of the opening region, and the second superconductor layer is formed in a second section of the opening region, and the first section of the opening region and the second section of the opening region only partially overlap.

In some implementations the superconductor tunnel junction is formed where the first section of the opening region and the second section of the opening region partially overlap.

In some implementations the first contact is formed on the surface of the first superconductor layer outside of where the first section of the opening region and the second section of the opening region partially overlap, and the second contact is formed on the surface of the second superconductor layer outside of where the first section of the opening region and the second section of the opening region partially overlap.

In some implementations the first contact extends away from a first side of the opening region, and the second contact extends away from a second different side of the opening region.

In some implementations the first contact and the second contact extend along orthogonal directions.

In some implementations forming the third superconductor layer comprises: forming a second resist layer on the first superconductor layer and the second superconductor layer; and patterning the second resist layer to form a first contact opening and a second contact opening; and depositing the third superconductor on the patterned second resist layer and removing the second resist layer to form the first contact and the second contact.

In some implementations the method further comprises performing an ion mill on a surface of the first superconductor layer exposed in the first contact opening and on a surface of the second superconductor layer exposed in the second contact opening prior to depositing the third superconductor layer.

In some implementations the first resist layer is patterned using optical lithography.

In some implementations a height of the resist layer is between approximately 0.1 microns to approximately 4 microns.

In some implementations the superconductor tunnel junction forms part of an analog circuit element or a single-flux quantum logic circuit element.

In general, another innovative aspect of the subject matter described in this specification can be implemented in a device comprising: a substrate; a first superconductor layer on the substrate; an insulator layer on the first superconductor layer; a second superconductor layer on the insulator layer, wherein the first superconductor layer, the insulator layer, and the second superconductor layer form a superconductor tunnel junction; and a third superconductor layer directly on a surface of the first superconductor layer and directly on a surface of the second superconductor layer to provide a first contact to the superconducting tunnel junction and a second contact to the superconductor tunnel junction, respectively.

The foregoing and other implementations can each optionally include one or more of the following features, alone or in combination. In some implementations the first superconductor layer comprises a first portion that forms a bottom electrode to the superconductor tunnel junction, and comprises a second portion directly adjacent to the bottom electrode, wherein the first contact is formed directly on the second portion of the first superconductor layer, and the second superconductor layer comprises a first portion that forms a top electrode to the superconductor tunnel junction, and comprises a second portion directly adjacent to the top electrode, wherein the second contact is formed directly on the second portion of the second superconductor layer.

In some implementations the second portion of the first superconductor layer comprises a corresponding wide section and a corresponding narrow section having a length extending outwardly from the wide section of the first superconductor layer, and the second portion of the of the second superconductor layer comprises a corresponding wide section and a corresponding narrow section having a length extending outwardly from the wide section of the second superconductor layer.

In some implementations the superconductor tunnel junction forms part of an amplifier circuit element.

In some implementations superconductor tunnel junction forms part of an analog circuit element.

In some implementations the superconductor tunnel junction forms part of a single-flux quantum logic circuit element.

The subject matter described in this specification can be implemented in particular ways so as to realize one or more of the following advantages.

For example, in some implementations, the processes disclosed herein can be used to fabricate Josephson junctions having junction leads with reduced stray series inductance. Alternatively, or in addition, the techniques disclosed herein can be used to increase Josephson junction critical currents due to an increase in a size of an overlap region between layers of superconductor material. In some cases, the fabrication processes described herein reduce the number of patterning steps necessary to form the junctions. Fewer patterning steps may lead to the wafer being removed fewer times from a deposition chamber, which in turn can reduce the risk of defects and simplifies the fabrication process.

Josephson junctions fabricated using the two-angle deposition techniques described in this specification can be of arbitrary size (independent of electrode width) without incurring accidental shorting out. This is in contrast to Josephson junctions that are fabricated using other known two-angle deposition techniques, where the side arms of the junction cannot be made arbitrarily large due to the resist layer side walls or due to an increasing risk of shorting out.

Josephson junctions fabricated using the techniques described in this specification can be fabricated in parallel, since junction patterning may be performed using photolithography instead of e-beam lithography. E-beam lithography requires serial exposure of each individual junction feature on a wafer, whereas with optical lithography all features are exposed simultaneously. Depending on the particular device and wafer size there can be ~1e6 junctions/wafer.

In some implementations, Josephson junctions fabricated using the techniques described in this specification allow for probing and characterization of the junction for in-line metrology during the fabrication process, since prior to completing each deposition step the junction can be electrically connected to a circuit, e.g., via regions 104a and 104b of FIG. 1A.

In some implementations, Josephson junctions fabricated using the techniques described in this specification have improved reproducibility of the junction critical current since differences in area does not dominate resistance variation (as could be the case in smaller junctions).

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

FIG. 2 is a flow chart of a first example process for fabricating a low stray inductance Josephson junction.

FIG. 4 is a flow chart of a second example process for fabricating low stray inductance Josephson junctions.

DETAILED DESCRIPTION

Quantum computing entails coherently processing quantum information stored in the qubits of a quantum computer. Superconducting quantum computing is one implementation of quantum computing technology in which quantum information processing devices are formed, in part, from superconducting materials. Fabrication of integrated quantum information processing devices with superconducting components typically involves depositing and patterning superconducting materials, dielectrics and metal layers. Some quantum information processing devices, such as qubits, can be constructed using Josephson junctions.

A Josephson junction may be made by sandwiching a layer or "barrier" of a non-superconducting material between two layers of a superconducting material. The layer of non-superconducting material is thin enough to allow electrons to quantum mechanically tunnel through the non-superconducting material from one superconducting layer to another. That is, until a critical current is reached, a supercurrent can flow across the barrier and electron pairs can tunnel across the barrier without any resistance. For quantum computing a superconducting logic applications, the barrier material is an insulator, e.g., aluminum oxide.

One technique for fabricating Josephson junctions is a double-angle deposition liftoff process. During this process, a first superconductor layer is deposited at a first angle relative to patterned resist features on a wafer, followed by an oxidation of the first superconductor layer, and then followed by a second superconductor deposition at a second angle relative to the patterned resist. The two angles of the deposition result in two shifted images of the resist pattern. This technique relies on shadowing from the resist stack to mask off segments of the pattern to create two electrically distinct metal regions that are connected through the junction oxide in a well-defined overlap region in the pattern.

Josephson Junctions with Reduced Stray Inductance

The present disclosure provides methods and devices for fabricating Josephson junctions with reduced stray series inductance of junction leads using a double-angle deposition process.

Figure 1A:
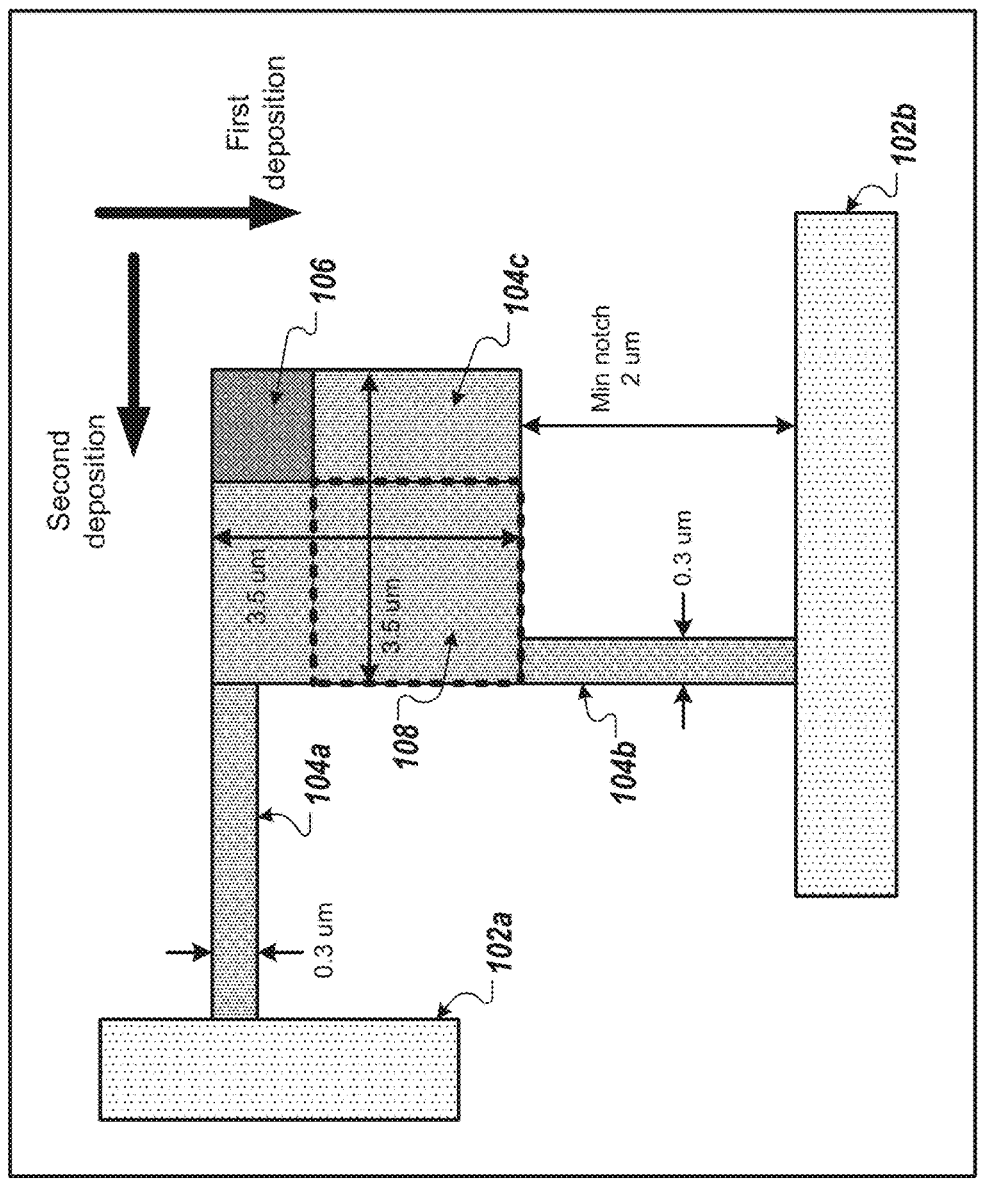
FIG. 1A is a schematic diagram of an example state of the art double angle Josephson junction.
Figure 1B:
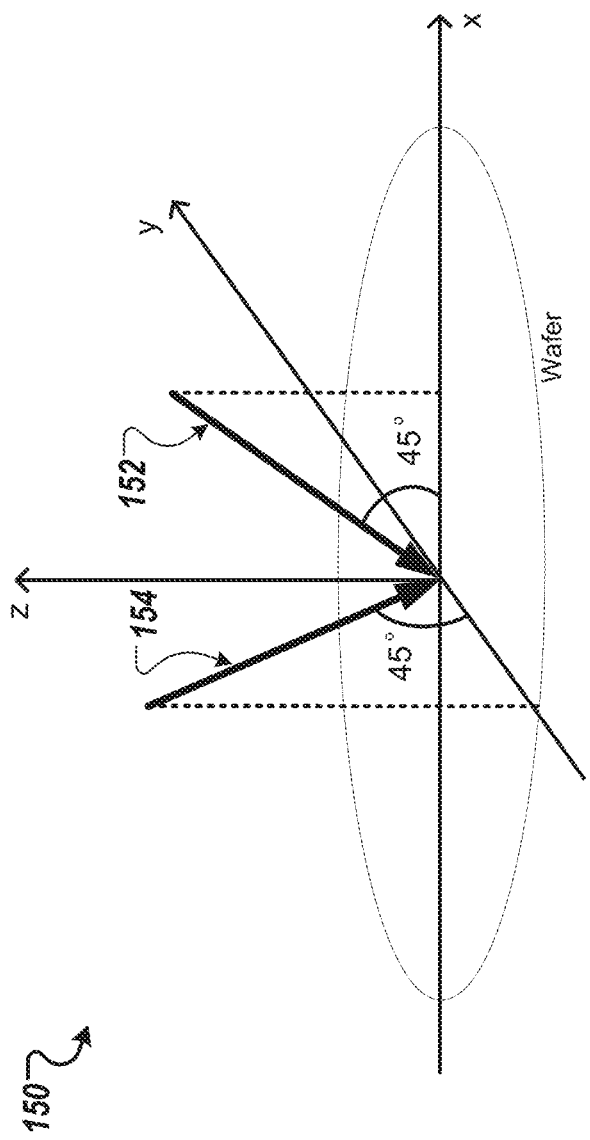
FIG. 1B is a schematic diagram of example deposition angles with respect to a wafer.

FIG. 1A is a schematic diagram of an example double-angle Josephson junction. Regions 102a, 102b represent a lithographically defined portion of the circuit. Regions 104a, 104b, 104c represent the superconductor that is deposited in the two angle steps as will be described below. The region enclosed by the dashed line 108 represents the region of overlap that forms the junction, and region 106 represents a portion of the pattern that is masked off by the resist during the two deposition steps. FIG. 1B is a schematic diagram of example deposition angles with respect to a wafer. Unlike other double angle deposition techniques, the first deposition is represented by arrow 152 along the negative x axis (as opposed to deposition along the + axis). The first deposition is 45θ from the wafer upper surface (the surface on which the components are formed), however in some cases the first deposition angle may take other values. The second deposition is represented by arrow 154 along the positive y axis (as opposed to deposition along the − axis). The second deposition is also 45° from the wafer upper surface, however this is an example only and in some cases the second deposition angle may take other values.

The double-angle deposition technique used in this specification requires that the leads connecting the junctions to the rest of the circuit are long and narrow. The width of these leads must be sufficiently small to enable masking from the resist stack, and their length is usually constrained by minimum spacing design rules of the process. For example, the leads may be 2 μm in length and 0.3-0.7 μm in width, even if the junction itself measures several μm across.

A consequence of the geometry of the junction leads is that the leads present a substantial series inductance leading to the junction, which is unacceptable in applications such as Josephson logic, Josephson amplifiers, and microwave components. Furthermore, because of the high aspect ratio of the leads, their inductance may be more difficult to control with respect to variations in the fabrication process.

One exemplary process for fabricating Josephson junctions with reduced stray inductance is described as follows with reference to FIG. 2 and FIGS. 3A-3D.

FIG. 2 is a flow diagram of a first example process 200 for forming a Josephson junction with reduced stray inductance. For example, the process 200 may be used to form the Josephson junction illustrated in FIG. 3D of the present application.

Figure 3A:
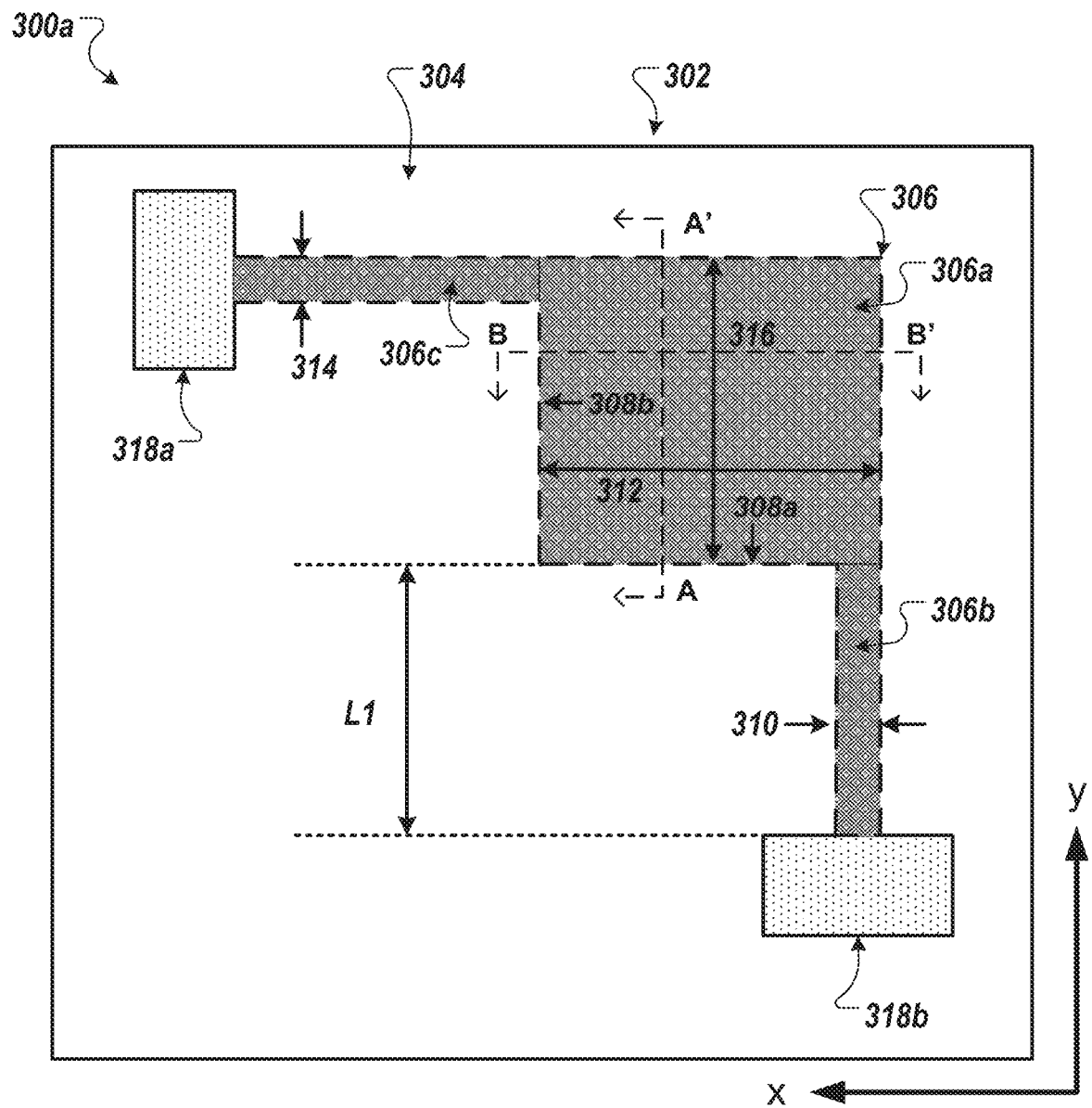
FIGS. 3A-3D are schematic diagrams of a plan view and cross-sectional views of an example substrate during the first example process for forming a Josephson junction with reduced stray inductance.
Figure 3A:
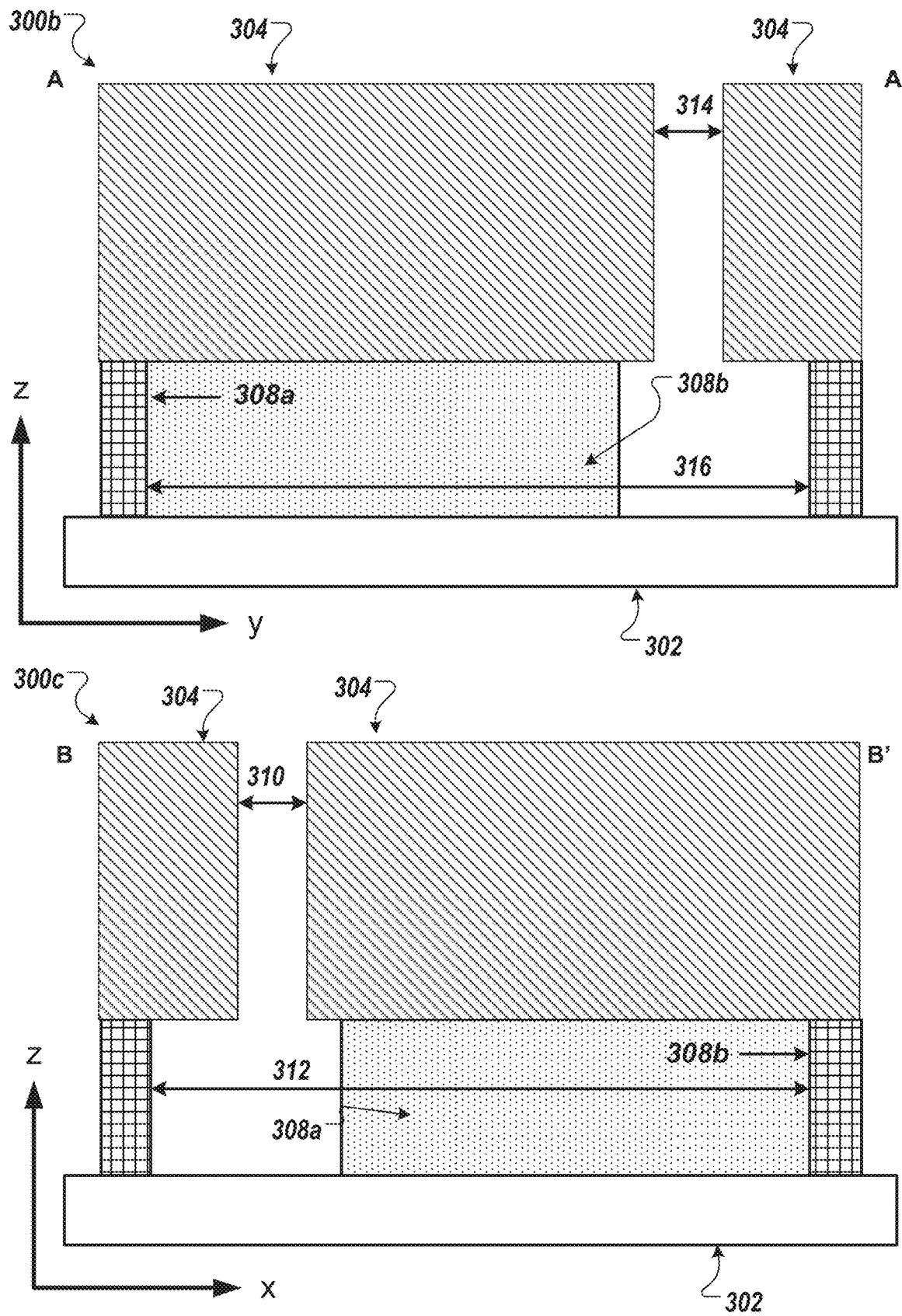

A substrate including a first resist layer that has been patterned to expose an opening region is provided (step 202). FIG. 3A shows a schematic of the provided substrate.

The first resist layer may have been patterned using optical lithography, and may have a height between approximately 0.1 microns to approximately 4 microns. In some implementations the first resist layer may include a bilayer resist stack where the bottom part of the stack is an undercut layer, and the top part is an imaging layer.

The opening region includes a central opening portion, a first elongated opening portion having a length that extends from a first side of the central opening portion along a first direction, and a second elongated portion having a length that extends from a second side of the central opening portion along a second direction different from, e.g., orthogonal to, the first direction.

The width of the first elongated portion is smaller than the width of the first side of the central opening. In addition, the width of the second elongated portion is smaller than the length of the second side of the central opening. In some implementations, an aspect ratio between the height of the first resist layer and the width of the first elongated opening portion or the width of the second elongated opening portion may be between 1:1 and 10:1.

Figure 3B:
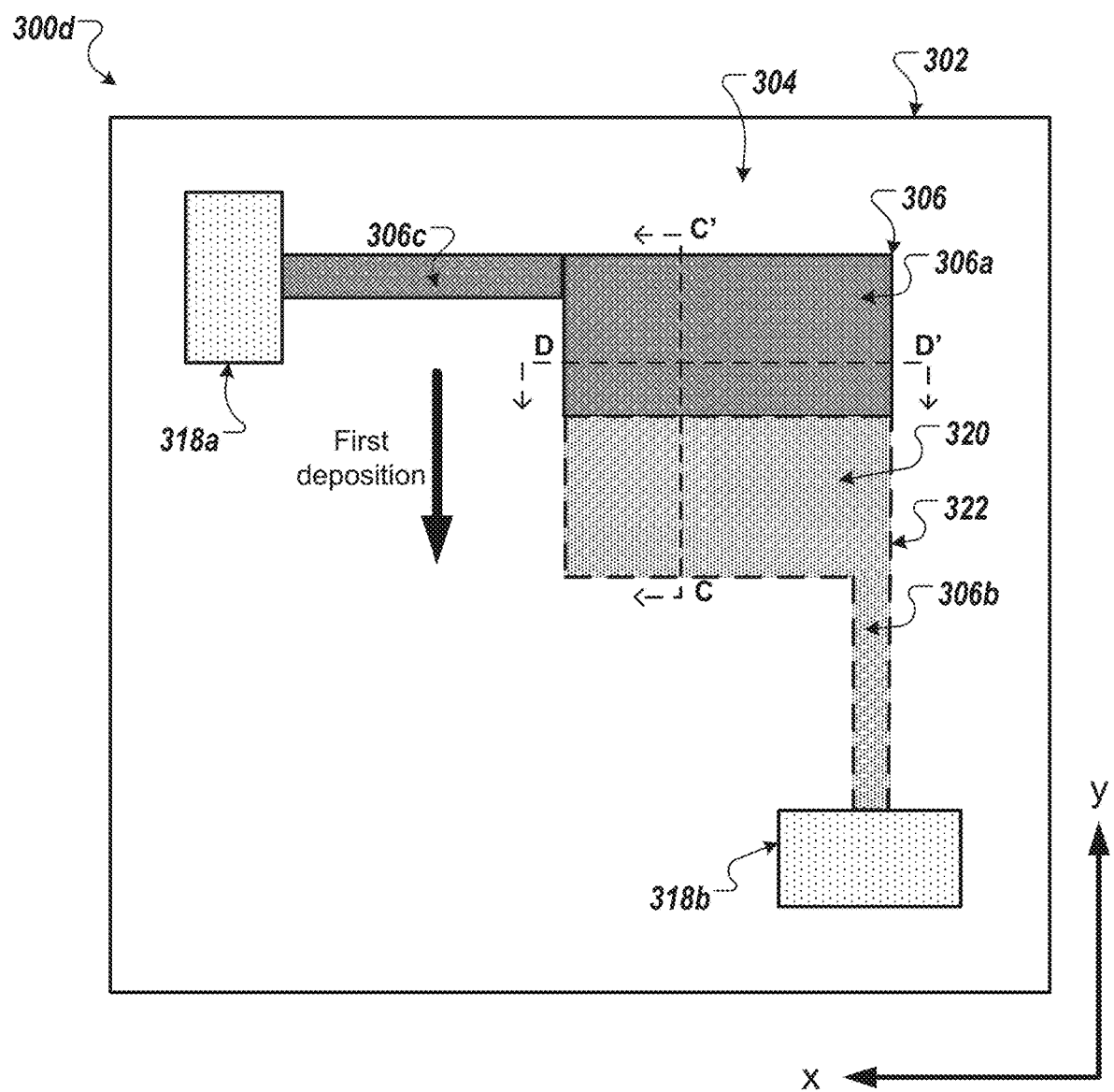

A first superconductor material is deposited on the patterned resist layer at a first non-normal angle with respect to the substrate to form a first superconductor layer within the central opening portion and the first elongated opening portion of the opening region (step 204). FIG. 3B shows a schematic of the substrate after a first superconductor material is deposited on the first resist layer.

Figure 3C:
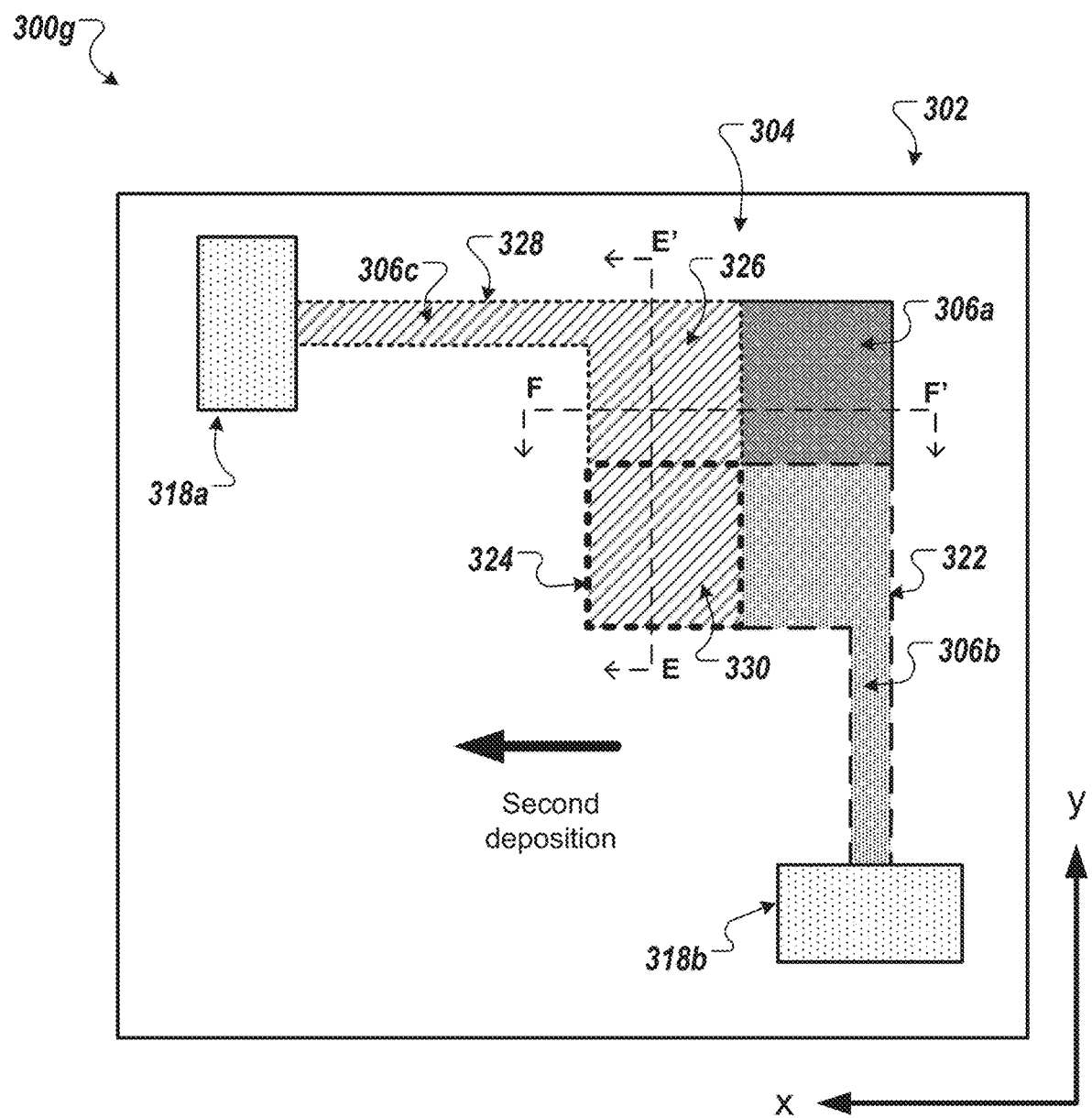
Figure 3C:
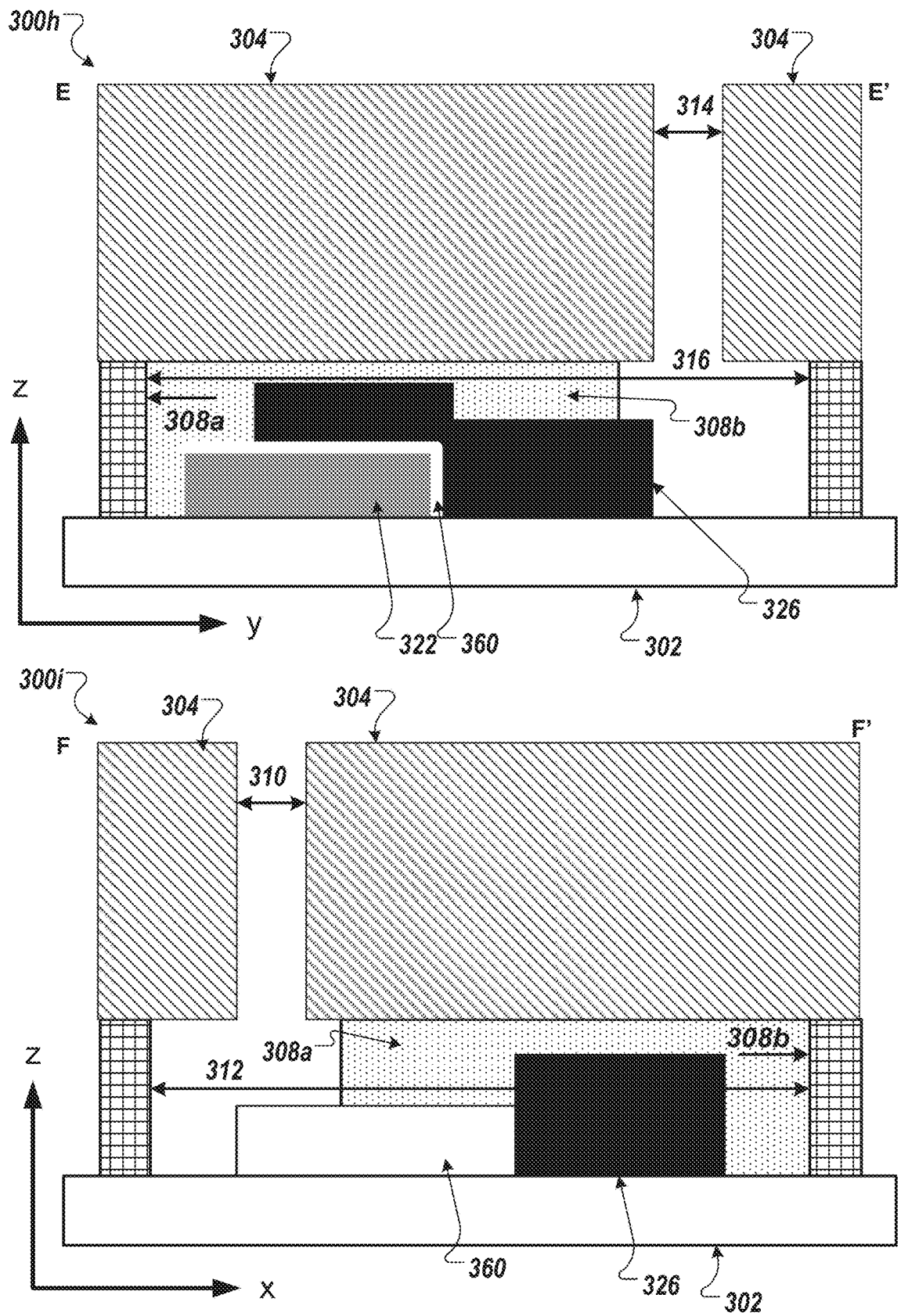

An insulator layer is formed on a portion of the first superconductor layer (step 206). FIG. 3C shows a schematic of the substrate an insulator layer is formed on a portion of the first superconducting layer.

A second superconductor material is deposited on the insulator layer and the patterned resist layer at a second non-normal angle with respect to the substrate to form a second superconductor layer within the central opening portion and the second elongated opening portion of the opening region (step 208). The first superconductor layer, the insulator layer, and the second superconductor layer within the central opening portion provide a superconductor tunnel junction.

In some implementations, the first superconductor layer may be formed in a first section of the central opening portion, and the second superconductor layer may be formed in a second section of the central opening portion, wherein the first section of the central opening portion and the second section of the central opening portion only partially overlap. In these implementations the superconductor tunnel junction may be formed where the first section of the central opening portion and the second section of the central opening portion partially overlap.

Figure 3D:
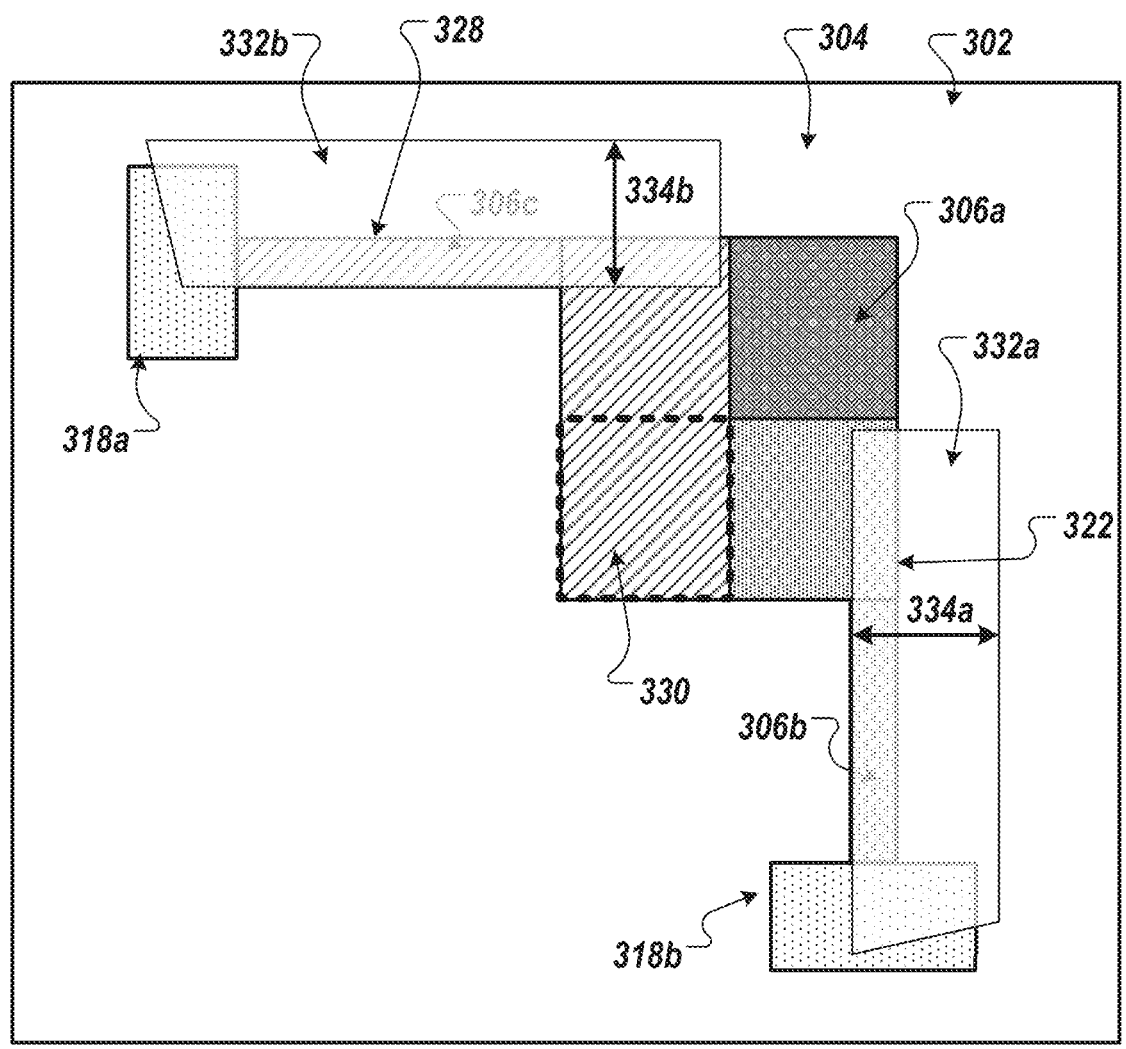

A third superconductor layer is formed directly on a surface of the first superconductor layer and directly on a surface of the second superconductor layer to provide a first contact to the superconducting tunnel junction and a second separate contact to the superconductor tunnel junction, respectively (step 212). FIG. 3D shows a schematic of the substrate after a third superconductor layer has been formed directly on a portion of the surface of the first superconductor layer and a portion of the surface of the second superconductor layer.

Forming the third superconductor layer may include forming a second resist layer on the first superconductor layer and on the second superconductor layer (step 210), patterning the second resist layer to form a first contact opening and a second contact opening (step 210), and depositing the third superconductor material on the patterned second resist layer. The third superconductor material may be deposited at an angle that is normal relative to the substrate. Forming the third superconductor layer may then further include removing the second resist layer to form the first contact and the second contact. Optionally, an ion mill may be performed on a surface of the first superconductor layer exposed in the first contact opening and on a surface of the second superconductor layer exposed in the second contact opening prior to depositing the third superconductor layer.

In implementations where the superconductor tunnel junction is formed where the first section of the central opening portion and the second section of the central opening portion partially overlap, the first contact may be formed on the surface of the first superconductor layer outside of where the first section of the central opening portion and the second section of the central opening portion partially overlap. Similarly, the second contact may be formed on the surface of the second superconductor layer outside of where the first section of the central opening portion and the second section of the central opening portion partially overlap.

In some implementations, the first contact may be formed on the surface of the first superconductor layer that is within the first elongated opening portion. In some implementations the second contact may be formed on the surface of the second superconductor layer that is within the second elongated opening portion. The width of the first contact may be greater than the width of the first superconductor layer within the first elongated portion. In addition, the width of the second contact may be greater than the width of the second superconductor layer within the second elongated portion.

For convenience, the process 200 has been described with reference to forming a single Josephson junction using a first resist layer that has been patterned to expose a single opening region. However, in some implementations the first resist layer may include multiple opening regions so that the process 200 can be used to form multiple Josephson junctions in parallel.

The device formed by process 200, e.g., the device shown in FIG. 3D below, may be provided for use in various applications. For example, the device may be provided for use as an element in a quantum circuit, a Josephson amplifier or as a microwave component. As another example, the device may be provided for use as an element in an analog circuit, e.g., a microwave component such as a switch, mixer, phase shifter, resonator, filter or detector.

FIGS. 3A-3D are schematic diagrams of a plan view and cross-sectional views of an example substrate 302 during the first example process 200 for forming a Josephson junction with reduced stray inductance.

FIG. 3A shows a schematic of a provided substrate 302 in plan-view 300a, cross-sectional view 300b through axis A-A', and cross-sectional view 300c through axis B-B'. The provided substrate 302 corresponds to the substrate provided at step 202 of FIG. 2.

The substrate 302 includes a first resist layer 304 that is used to define the Josephson junction. In some implementations, the height of the first resist layer 304 may be, e.g., between approximately 0.1 microns to approximately 4 microns. The first resist layer 304 is patterned to expose an opening region 306 defined by the dashed lines. The size of the area of the opening 306 is dependent on the process and the circuit to which the junction will be connected. However, the size of the area of the opening 306 may be limited by factors such as defectivity, stray capacitance of the junction and fabrication considerations. As an example, the size of the area of the opening 306 may be smaller than 5.0 μm by 5.0 μm. In some implementations, the first resist layer 304 may be patterned using optical lithography.

The opening region 306 includes a central opening portion 306a, a first elongated opening portion 306b, and a second elongated opening portion 306c.

The first elongated opening portion 306b has a length that extends from a first side 308a of the central opening portion 306a along a first direction. The width 310 of the first elongated opening portion 306b is smaller than the length 312 of the first side 308a of the central opening 306a (or, equivalently, narrower than the width of the central opening portion 306a). In some implementations the width 310 may be approximately equal to 0.3 μm. In some implementations the length L1 of the first elongated opening portion 306b may be approximately equal to 2 μm. In some implementations an aspect ratio between a height of the first resist layer 304 and a width 310 of the first elongated opening portion 306b s between 1:1 and 10:1.

The second elongated portion 306c has a length that extends from a second side 308b of the central opening portion 306a along a second direction that is different from the first direction. For example, the first direction is orthogonal to the second direction. The width 314 of the second elongated portion 306c is smaller than the length of the second side 308b of the central opening portion 306a (or, equivalently, narrower than the height 316 of the central opening portion 306a). In some implementations the width 314 may be approximately equal to 0.3 μm and/or the height 316 of the central opening portion 306a may be approximately equal to 3.5 μm. In some implementations an aspect ratio between a height of the first resist layer 304 and a width 314 of the second elongated opening portion 306c may be between 1:1 and 10:1.

Each of the elongated portions 306b, 306c may be coupled to a first and second device or component, 318b, 318c, respectively, that are formed on the substrate 302. For example, devices or components 318b, 318c may include a ground connection, a capacitor, an inductor, another Josephson junction, a co-planar waveguide, a qubit, a qubit readout resonator, a qubit control element (e.g., a qubit Z-control or qubit XY control element), among other circuit elements.

FIG. 3B shows a schematic of the substrate 302 in plan-view 300d, cross-sectional view 300e through axis C-C', and cross-sectional view 300f through axis D-D' after a first superconductor material 320 is deposited on the first resist layer 304 shown in FIG. 3A. For example, the schematic of the substrate 302 shown in FIG. 3B corresponds to step 204 of FIG. 2. In some implementations, the first superconductor material 320 may be aluminum.

The first superconductor material 320 may be deposited on the first resist layer 304 at a first non-normal angle with respect to an upper surface of the substrate 302, as described above with reference to FIG. 1B. In some implementations, the first non-normal angle may be 45 degrees. Depositing the first superconductor material 320 at the first non-normal angle with respect to the substrate surface 302 forms a first superconductor layer 322 (defined by the dashed lines) within the central opening portion 306a and the first elongated opening portion 306b of the opening region 306.

FIG. 3C shows a schematic of the substrate 302 in plan-view 300g, cross-sectional view 300h through axis E-E', and cross-sectional view 300i through axis F-F' after an insulator layer 360, e.g., an oxide layer, is formed on a portion of the first superconducting layer 322 of FIG. 3B and a second superconductor material 326 is deposited on the insulator layer 360 and the first resist layer 304 shown in FIG. 3A. For example, the schematic of the substrate 302 shown in FIG. 3C corresponds to step 206 of FIG. 2. In some implementations, the second superconductor material 326 may be aluminum.

The second superconductor material 326 may be deposited on the insulator layer 360 and the first resist layer 304 at a second non-normal angle with respect to the substrate 302, as described above with reference to FIG. 1B. In some implementations, the second non-normal angle may be 45 degrees. Depositing the second superconductor material 326 at the second non-normal angle with respect to the substrate surface 302 forms a second superconductor layer 328 (defined by the dotted lines) within the central opening portion 306a and the second elongated opening portion 306c of the opening region 306.

The portions of the first superconductor layer 322, the insulator layer 360, and the second superconductor layer 328 that lie within the central opening portion 306a and that overlap provide a superconductor tunnel junction. In some implementations, a first section of the central opening portion 306a in which the first superconductor layer 322 is formed and a second section of the central opening portion 306a in which the second superconductor layer 328 is formed may only partially overlap, e.g., in area 330. In the example shown in FIG. 3C, the superconductor tunnel junction is defined within the region enclosed by dashed lines 324.

FIG. 3D shows a schematic of the substrate 302 after a third superconductor layer has been formed directly on a portion of the surface of the first superconductor layer 322 of FIG. 3C and a portion of the surface of the second superconductor layer 328 of FIG. 3C. For example, the schematic of the substrate 302 shown in FIG. 3D corresponds to step 212 of FIG. 2.

The third superconductor layer provides a first contact 332a to the superconducting tunnel junction 330 and a second separate contact 332b to the superconductor tunnel junction 330, respectively. Deposition of the third superconductor layer provides electrical contact to the superconductor tunnel junction 330 and to the rest of the circuit (e.g., lithographically defined portions 318a and 318b) to provide a current path.

In some implementations, the first contact 332a may be formed on the surface of the first superconductor layer 322 outside of where the first section of the central opening portion 306a and the second section of the central opening portion 306a partially overlap, e.g., outside of region 330. In these implementations the first contact 332a may be formed on the surface of the first superconductor layer 322 that is within the first elongated opening portion 306b.

Similarly, in some implementations the second contact 332b may be formed on the surface of the second superconductor layer 328 outside of where the first section of the central opening portion 306a and the second section of the central opening portion 306a partially overlap, e.g., outside of region 330. In these implementations the second contact 332b may be formed on the surface of the second superconductor layer 328 that is within the second elongated opening portion 306c.

The width 334a of the first contact 332a is greater than the width of the first superconductor layer 322 within the first elongated portion 306b (e.g., width 310 of FIG. 3A). Similarly, the width 334b of the second contact 332b is greater than the width of the second superconductor layer 328 within the second elongated portion 306b (e.g., width 314 of FIG. 3A). In some implementations, the width 334a of the first contact 332a and/or width 334b of the second contact 332b may be approximately equal to 2 μm, or equal to a value between 2 μm and 5 μm. Such widths can reduce the Josephson junction lead stray inductance to approximately 2 pH per lead. In cases where a wider contact is required, additional width can be realized by extending other elements, e.g., lithographically defined portions 318a and 318b.

Another exemplary process for fabricating Josephson junctions with reduced stray inductance is described as follows with reference to FIG. 4 and FIGS. 5A-5C.

FIG. 4 is a flow diagram of a second example process 400 for forming a Josephson junction with reduced stray inductance. For example, the process 400 may be used to form the Josephson junction illustrated in FIG. 5D of the present application.

A substrate including a first resist layer patterned to include an opening region that exposes a surface of the substrate is provided (step 402). In some implementations the first resist layer may be a bilayer, i.e., a later suitable for angled deposition techniques. In some implementations, the first resist layer may have been patterned using optical lithography, and may have a height between approximately 0.1 microns to approximately 4 microns.

Figure 5A:
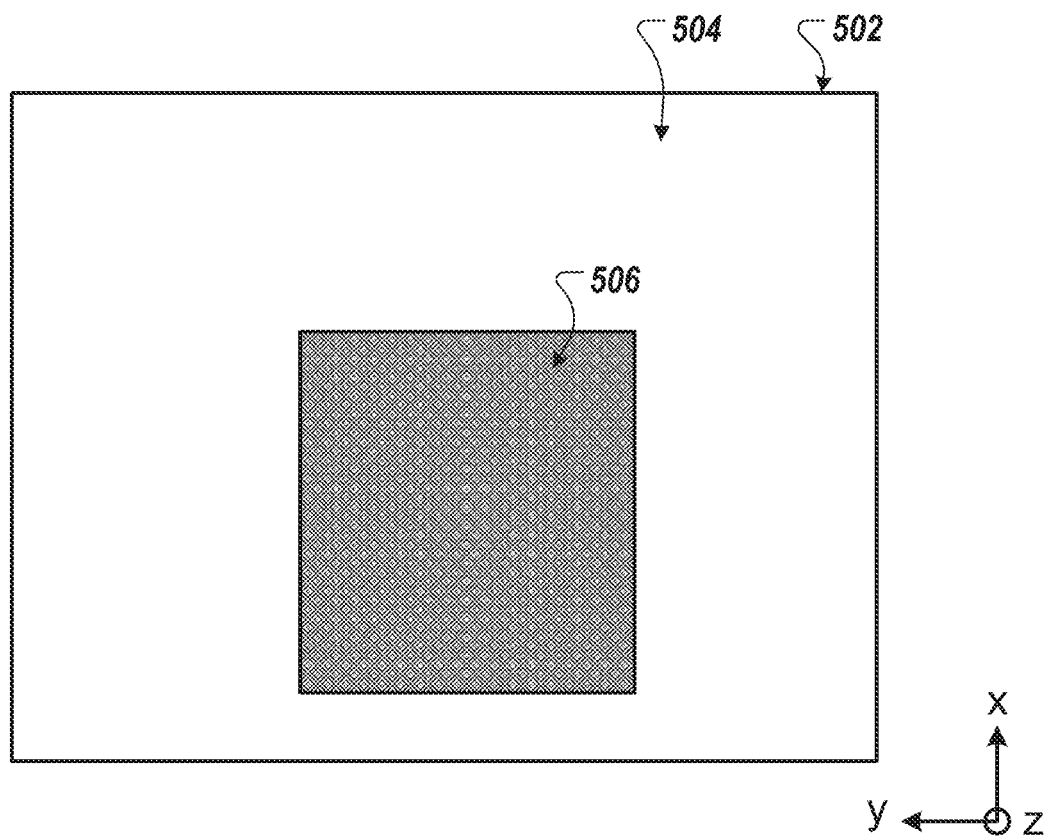
FIGS. 5A-5D are schematic diagrams of a plan view of an example substrate during the second example process for forming a Josephson junction with reduced stray inductance.

The opening region may be, e.g., in the shape of a rectangle (such as a square) that is laterally enclosed on all sides by the first resists layer. For instance, the opening region is a central opening region that is without any elongated opening portions that extend outwardly from the central opening region. The size of the area of the central opening region is dependent on the deposition angle and the resist thickness. For example, the area of the central opening region may be at least 1 μm by 1 μm for a 1 μm thick resist and 45 degree deposition angle. A schematic of the substrate provided at step 402 is shown in FIG. 5A.

Figure 5B:
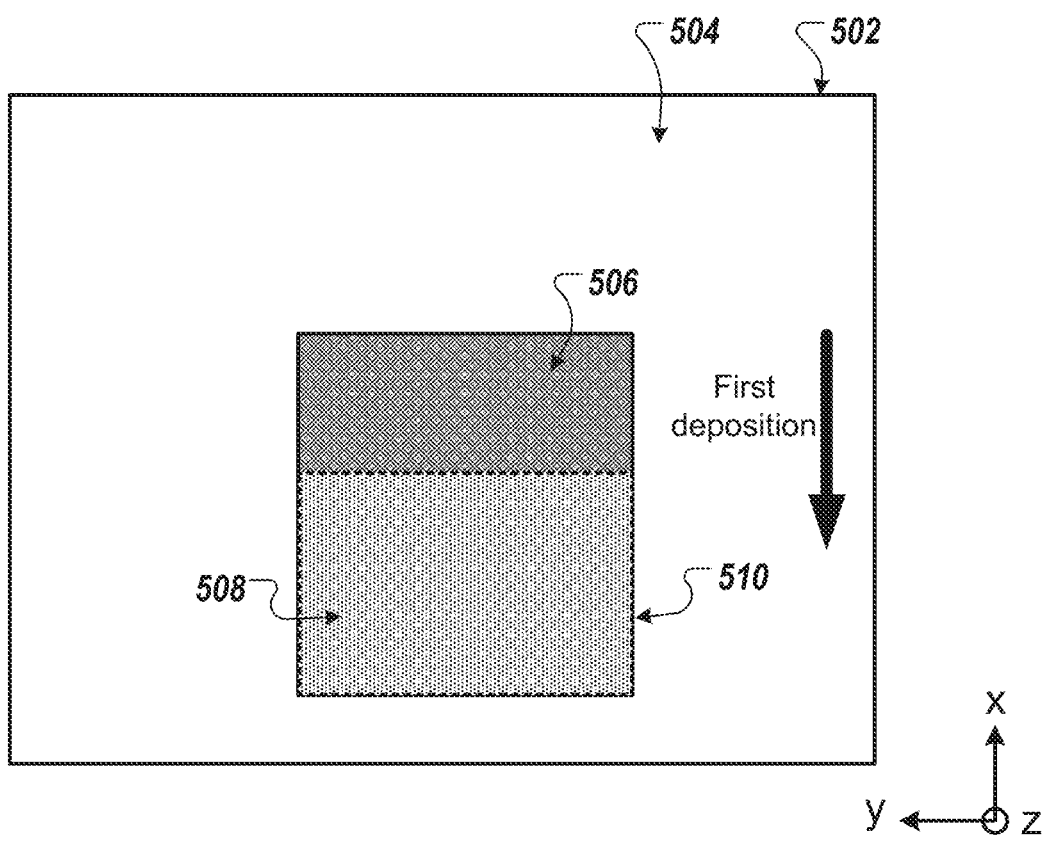

A first superconductor material is deposited on the patterned resist layer at a first non-normal angle with respect to the substrate along a first direction to form a first superconductor layer within the opening region (step 404). The patterned resist layer blocks the first superconductor layer from forming in at least a first part of the opening region. FIG. 5B shows a schematic of the substrate after a first superconductor material is deposited on the first resist layer.

An insulator layer is formed on a portion of the first superconductor layer (step 406).

Figure 5C:
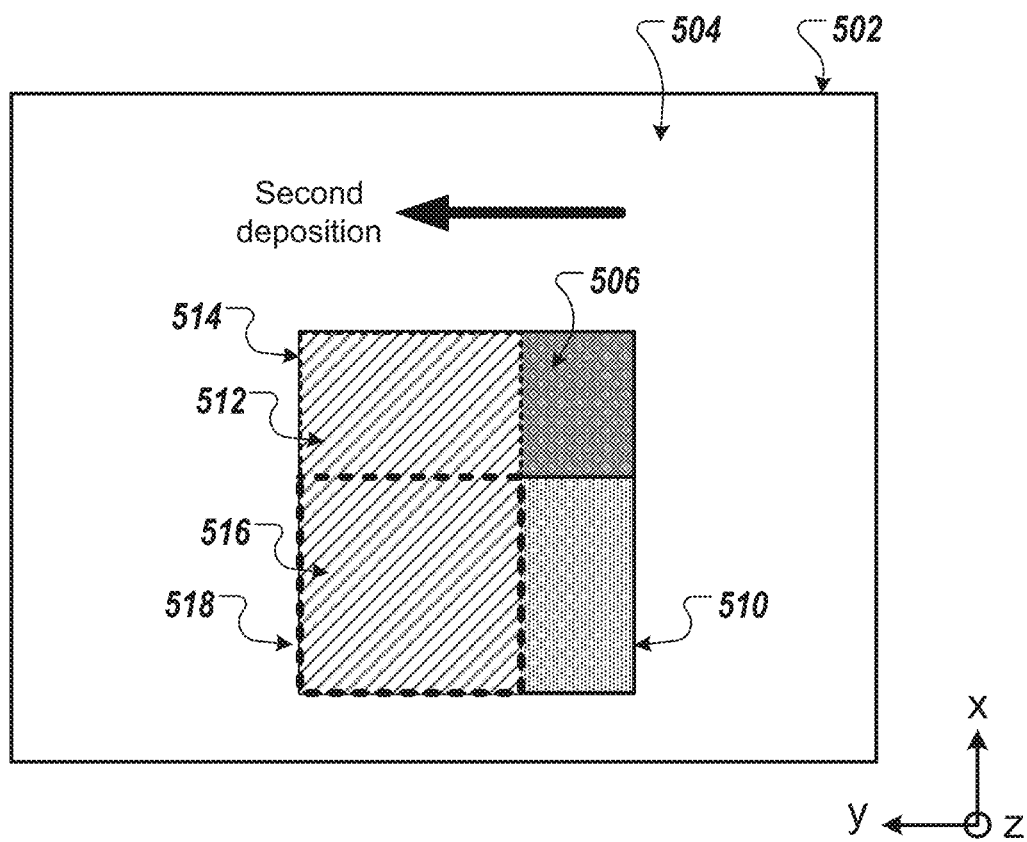

A second superconductor material is deposited on the insulator layer and the patterned resist layer at a second non-normal angle with respect to the substrate along a second direction to form a second superconductor layer within the opening region (step 408). The patterned resist layer blocks the second superconductor layer from forming in at least a second part of the opening region, and the first superconductor layer, the insulator layer, and the second superconductor layer within the opening region provide a superconductor tunnel junction. FIG. 5C shows a schematic of the substrate after an insulator layer is formed on a portion of the first superconducting layer and a second superconductor material is deposited on the insulator layer and the first resist layer.

In some implementations, the first superconductor layer may be formed in a first section of the opening region, and the second superconductor layer may be formed in a second section of the opening region. The first section of the opening region and the second section of the opening region may only partially overlap. In these implementations, the superconductor tunnel junction may be formed where the first section of the opening region and the second section of the opening region partially overlap.

Figure 5D:
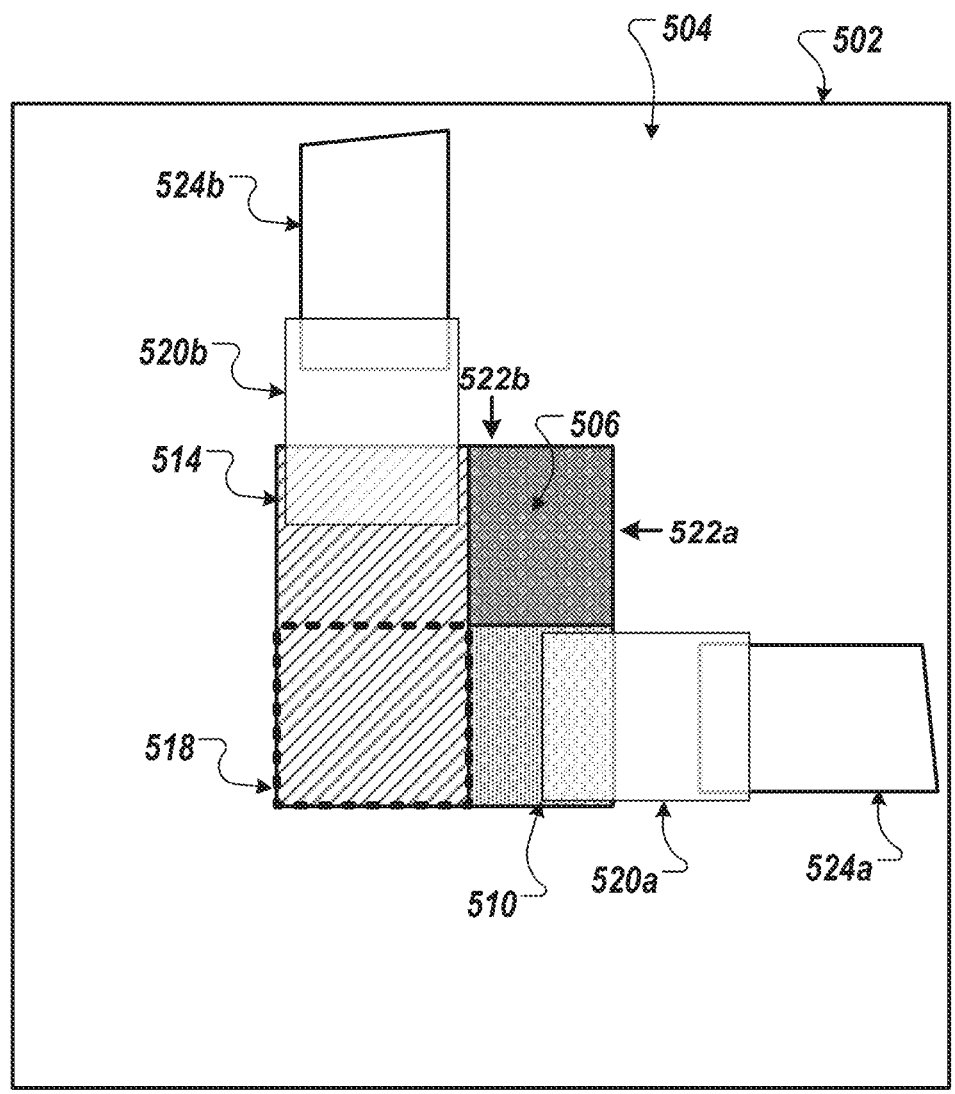

A third superconductor layer is formed directly on a surface of the first superconductor layer and directly on a surface of the second superconductor layer (after a second patterning step, as described below) to provide a first contact to the superconducting tunnel junction and a second separate contact to the superconductor tunnel junction, respectively (step 410). The first contact may be formed on the surface of the first superconductor layer outside of where the first section of the opening region and the second section of the opening region partially overlap. Similarly, the second contact may be formed on the surface of the second superconductor layer outside of where the first section of the opening region and the second section of the opening region partially overlap. FIG. 5D shows a schematic of the substrate after a third superconductor layer has been formed directly on a portion of the surface of the first superconductor layer and a portion of the surface of the second superconductor layer.

In some implementations, the first contact extends away from a first side of the opening region, and the second contact extends away from a second different side of the opening region. In these implementations the first contact and the second contact may extend along orthogonal directions.

Forming the third superconductor layer may include forming a second resist layer on the first superconductor layer and the second superconductor layer, patterning the second resist layer to form a first contact opening and a second contact opening, and depositing the third superconductor on the patterned second resist layer and removing the second resist layer to form the first contact and the second contact. Optionally, an ion mill may be performed on a surface of the first superconductor layer exposed in the first contact opening and on a surface of the second superconductor layer exposed in the second contact opening prior to depositing the third superconductor layer.

For convenience, the process 400 has been described with reference to forming a single Josephson junction using a first resist layer that has been patterned to expose a single opening region. However, in some implementations, the first resist layer may include multiple opening regions so that the process 400 can be used to form multiple Josephson junctions in parallel.

The device formed by process 400, e.g., the device shown in FIG. 5D below, may be provided for use in various applications. For example, the device may be provided for use as an element in a quantum circuit, a Josephson amplifier or as a microwave component. As another example, the device may be provided for use as an element in an analog circuit, e.g., as a microwave component such as a switch, mixer, phase shifter, resonator, filter or detector.

FIGS. 5A-5D are schematic diagrams of a plan view of an example substrate 502 during the second example process 400 for forming a Josephson junction with reduced stray inductance.

FIG. 5A shows a schematic of the provided substrate 502. The substrate 502 includes a first resist layer 504 that is used to define the Josephson junction. In some implementations the height of the first resist layer 504 may be between approximately 0.1 microns to approximately 4 microns. The first resist layer 504 is patterned to include an opening region 506 that exposes a surface of the substrate 502. For example, the first resist layer 504 may be patterned using optical lithography. The opening region 506 includes, e.g., a rectangular opening region (such as a square opening region) that is laterally enclosed on all sides by the first resist layer 504. For instance, the opening region 506 is a central opening region that is without any elongated opening portions (such as elongated portions 306c, 306b shown in FIG. 3A) that extend outwardly from the central opening region 506. The schematic of the substrate 502 shown in FIG. 5A corresponds to step 402 of FIG. 4.

FIG. 5B shows a schematic of the substrate 502 after a first superconductor material 508 is deposited on the first resist layer 504 shown in FIG. 5A. The schematic of the substrate 502 shown in FIG. 5B corresponds to step 404 of FIG. 4. In some implementations, the first superconductor material 508 may be aluminum.

The first superconductor material 508 may be deposited on the first resist layer 504 at a first non-normal angle along a first direction with respect to the upper surface of the substrate 502, as described above with reference to FIG. 1B. In some implementations the first non-normal angle may be 45 degrees. Depositing the first superconductor material 508 at the first non-normal angle along the first direction with respect to the substrate 502 forms a first superconductor layer 510 (defined by the dotted lines) within the opening region 506. As shown in FIG. 5B, the patterning of the resist layer 504 blocks the first superconductor layer 510 from forming in at least a first part of the opening region 506, e.g., in the top section of the opening region 506. An insulator layer, e.g., an oxide layer, can be formed on a portion of the first superconducting layer 510, which can serve as a barrier layer of a superconductor tunnel junction or a Josephson junction.

FIG. 5C shows a schematic of the substrate 502 after an insulator layer, e.g., an oxide layer, is formed on a portion of the first superconducting layer 510 of FIG. 5B and a second superconductor material 512 is deposited on the insulator layer and the first resist layer 504 shown in FIG. 5A. The schematic of the substrate 502 shown in FIG. 5C corresponds to step 406 of FIG. 4. In some implementations, the second superconductor material 512 may be aluminum.

The second superconductor material 512 may be deposited on the insulator layer and the first resist layer 504 at a second non-normal angle along a second direction with respect to the upper surface of the substrate 502, as described above with reference to FIG. 1B. In some implementations, the second non-normal angle may be 45 degrees. Depositing the second superconductor material 512 at the second non-normal angle along the second direction with respect to the substrate 502 forms a second superconductor layer 514 (defined by the shaded area) within the opening region 506. As shown in FIG. 5C, the patterning of the resist layer 504 blocks the second superconductor layer 514 from forming in at least a second part of the opening region 506, e.g., in the right most section of the opening region 506, leaving the right uppermost corner having no superconductor layer formed on the exposed portion of the substrate.

The first superconductor layer 510, the insulator layer, and the second superconductor layer 514 within the opening region 506 provide a superconductor tunnel junction. In some implementations, a first section of the opening portion 506 in which the first superconductor layer 510 is formed and a second section of the opening portion 506 in which the second superconductor layer 514 is formed may only partially overlap, e.g., in area 516. In these implementations, the superconductor tunnel junction may be formed where the first section of the opening portion 506 and the second section of the opening portion 506 partially overlap. In the example shown in FIG. 5C, the superconductor tunnel junction is defined within the region enclosed by dashed lines 518.

FIG. 5D shows a schematic of the substrate 502 after a third superconductor layer has been formed directly on a portion of the surface of the first superconductor layer 510 of FIG. 5B and a portion of the surface of the second superconductor layer 514 of FIG. 5C. The third superconductor layer provides a first contact 520a to the superconducting tunnel junction 518 and a second separate contact 520b to the superconductor tunnel junction 518, respectively. The schematic of the substrate 502 shown in FIG. 5D corresponds to step 410 of FIG. 4.

In some implementations, the first contact 520a may be formed on the surface of the first superconductor layer 510 outside of where the first section of the opening portion 506 and the second section of the opening portion 506 partially overlap, e.g., outside of region 516 of FIG. 5C. Similarly, in some implementations, the second contact 520b may be formed on the surface of the second superconductor layer 514 outside of where the first section of the opening portion 506 and the second section of the opening portion 506 partially overlap, e.g., outside of region 516 of FIG. 5C.

As shown in FIG. 5D, the first contact 520a may extend away from a first side 522a of the opening region 506, and the second contact 520b may extend away from a second different side 522b of the opening region. In some implementations, the first contact 520a and the second contact 520b may extend along orthogonal directions, i.e., the first side 522a and second side 522b may be orthogonal.

Deposition of the third superconductor layer in this manner provides electrical contact to the superconductor tunnel junction 518 and to the rest of the circuit, e.g., circuit elements 524a and 524b, to provide a low inductance current path. Circuit elements 524a and 524b may include, e.g., other components formed on the substrate including, e.g., ground connections, inductors, capacitors, other Josephson junctions, a qubit, a co-planar waveguide, a qubit readout resonator, a qubit control element (e.g., a qubit Z-control element or a qubit XY-control element), among other circuit elements. Although not shown in FIG. 5D, in some implementations circuit elements 520a, 520b, 524a, and 524b may be wider than the junction leads 514 and 510 (if needed, e.g., to reduce inductance).

An example of a superconducting material that can be used in the formation of quantum circuit elements is aluminum. Aluminum may be used in combination with a dielectric to establish Josephson junctions, which are a common component of quantum circuit elements. Examples of quantum circuit elements that may be formed with aluminum include circuit elements such as superconducting co-planar waveguides, quantum LC oscillators, qubits (e.g., flux qubits or charge qubits), superconducting quantum interference devices (SQUIDs) (e.g., RF-SQUID or DC-SQUID), inductors, capacitors, transmission lines, ground planes, among others. Other superconductor materials may include, e.g., niobium or titanium nitride.

Aluminum may also be used in the formation of superconducting classical circuit elements that are interoperable with superconducting quantum circuit elements as well as other classical circuit elements based on complementary metal oxide semiconductor (CMOS) circuitry. Examples of classical circuit elements that may be formed with aluminum include rapid single flux quantum (RSFQ) devices, reciprocal quantum logic (RQL) devices and ERSFQ devices, which are energy-efficient versions of RSFQ that does not use bias resistors. Other classical circuit elements may be formed with aluminum as well. The classical circuit elements may be configured to collectively carry out instructions of a computer program by performing basic arithmetical, logical, and/or input/output operations on data, in which the data is represented in analog or digital form.

Another example of a superconducting material that can be used in the formation of quantum circuit elements is Niobium. Niobium may be used in the formation of wiring, waveguides, inductors or capacitors. In some implementations different types of superconducting materials may be used in a same circuit element. For example, a first type of superconductor material, e.g. Niobium, may be used for wiring, waveguides, inductors, capacitors, etc., and a second type of superconductor, e.g., Aluminum, may be used for forming Josephson junctions.

Processes described herein may entail the deposition of one or more materials, such as superconductors, dielectrics and/or metals. Depending on the selected material, these materials may be deposited using deposition processes such as chemical vapor deposition, physical vapor deposition (e.g., evaporation or sputtering), or epitaxial techniques, among other deposition processes. Processes described herein may also entail the removal of one or more materials from a device during fabrication. Depending on the material to be removed, the removal process may include, e.g., wet etching techniques, dry etching techniques, lift-off processes, or chemical-mechanical polishing.

Implementations of the subject matter and operations described in this specification can be implemented in digital electronic circuitry, analog electronic circuitry, suitable quantum circuitry or, more generally, quantum computational systems, in tangibly-embodied software or firmware, in computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

Quantum circuit elements (also referred to as quantum computing circuit elements) include circuit elements for performing quantum processing operations. That is, the quantum circuit elements are configured to make use of quantum-mechanical phenomena, such as superposition and entanglement, to perform operations on data in a non-deterministic manner. Certain quantum circuit elements, such as qubits, can be configured to represent and operate on information in more than one state simultaneously. Examples of superconducting quantum circuit elements include circuit elements such as quantum LC oscillators, qubits (e.g., flux qubits, phase qubits, or charge qubits), and superconducting quantum interference devices (SQUIDs) (e.g., RF-SQUID or DC-SQUID), among others.

In contrast, classical circuit elements generally process data in a deterministic manner. Classical circuit elements can be configured to collectively carry out instructions of a computer program by performing basic arithmetical, logical, and/or input/output operations on data, in which the data is represented in analog or digital form. In some implementations, classical circuit elements can be used to transmit data to and/or receive data from the quantum circuit elements through electrical or electromagnetic connections. Examples of classical circuit elements include circuit elements based on CMOS circuitry, rapid single flux quantum (RSFQ) devices, reciprocal quantum logic (RQL) devices and ERSFQ devices, which are an energy-efficient version of RSFQ that does not use bias resistors.

In certain cases, some or all of the quantum and/or classical circuit elements may be implemented using, e.g., superconducting quantum and/or classical circuit elements. Fabrication of the superconducting circuit elements can entail the deposition of one or more materials, such as superconductors, dielectrics and/or metals. Depending on the selected material, these materials can be deposited using deposition processes such as chemical vapor deposition, physical vapor deposition (e.g., evaporation or sputtering), or epitaxial techniques, among other deposition processes. Processes for fabricating circuit elements described herein can entail the removal of one or more materials from a device during fabrication. Depending on the material to be removed, the removal process can include, e.g., wet etching techniques, dry etching techniques, lift-off processes, or chemical-mechanical polishing. The materials forming the circuit elements described herein can be patterned using known lithographic techniques (e.g., photolithography or e-beam lithography).

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties. A superconductor (alternatively superconducting) material can be understood as material that exhibits superconducting properties at or below a superconducting critical temperature. Examples of superconducting material include aluminum (superconductive critical temperature of 1.2 Kelvin) and niobium (superconducting critical temperature of 9.3 Kelvin). Accordingly, superconducting structures, such as superconducting traces and superconducting ground planes, are formed from material that exhibits superconducting properties at or below a superconducting critical temperature.

In certain implementations, control signals for the quantum circuit elements (e.g., qubits and qubit couplers) may be provided using classical circuit elements that are electrically and/or electromagnetically coupled to the quantum circuit elements. The control signals may be provided in digital and/or analog form.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A device comprising:
a substrate;
a first superconductor layer on a top surface of the substrate;
an insulator layer on a top surface of the first superconductor layer;
a second superconductor layer on a top surface of the insulator layer, wherein the first superconductor layer, the insulator layer, and the second superconductor layer form a Josephson junction; and
a third superconductor layer, wherein a first portion of the third superconductor layer is directly in contact with a top surface of the first superconductor layer and extends along a first direction to provide a first contact to the Josephson junction, and a second portion of the third superconductor layer is directly in contact with a top surface of the second superconductor layer and extends along a second direction to provide a separate second contact to the Josephson junction,
wherein an edge of the first contact is separate and laterally spaced apart from an edge of the second contact along the first direction,
wherein the first superconductor layer comprises a first portion that forms a bottom electrode to the Josephson junction, and
wherein the second superconductor layer comprises a first portion that forms a top electrode to the Josephson junction.

2. The device of claim 1, wherein the Josephson junction forms part of an analog circuit element.

3. The device of claim 1, wherein the Josephson junction forms part of a single-flux quantum logic circuit element.

4. The device of claim 1, wherein the first contact is formed on a part of the top surface of the first superconductor layer that does not overlap the Josephson junction.

5. The device of claim 1, wherein the second contact is formed on a part of the top surface of the second superconductor layer that does not overlap the Josephson junction.

6. A device comprising:
a substrate;
a first superconductor layer on a top surface of the substrate;
an insulator layer on a top surface of the first superconductor layer;
a second superconductor layer on a top surface of the insulator layer, wherein the first superconductor layer, the insulator layer, and the second superconductor layer form a Josephson junction; and
a third superconductor layer, wherein a first portion of the third superconductor layer is directly in contact with a top surface of the first superconductor layer to provide a first contact to the Josephson junction, and a second portion of the third superconductor layer is directly in contact with a top surface of the second superconductor layer to provide a separate second contact to the Josephson junction,
wherein the first contact is separate and laterally spaced apart from the second contact,
wherein the first superconductor layer comprises a first portion that forms a bottom electrode to the Josephson junction,
wherein the second superconductor layer comprises a first portion that forms a top electrode to the Josephson junction, and
wherein a second portion of the first superconductor layer extends along a first direction away from the bottom electrode of the Josephson junction, and a second portion of the second superconductor layer extends along a second direction away from the top electrode of the Josephson junction, wherein the first direction is orthogonal to the second direction.

7. The device of claim 6, wherein the first contact extends away from the bottom electrode of the Josephson junction along the first direction, and the second contact extends away from the top electrode of the Josephson junction along the second direction.

8. The device of claim 1, wherein the first contact provides a first low inductance current path to a first circuit element, and the second contact provides a second low inductance current path to a second circuit element.

9. The device of claim 8, wherein each of the first and second low inductance current paths comprises an inductance of less than 2 picoHenries (pH).

10. The device of claim 1, wherein the first superconductor layer, the second superconductor layer, and the third superconductor layer comprise aluminum.

11. The device of claim 1, wherein the insulator layer comprises aluminum oxide.

12. The device of claim 1, wherein the first contact and the second contact extend laterally to contact respective circuit elements that are laterally separated from the second portion of the first superconductor layer and the second portion of the second superconductor layer.

* * * * *